(12) United States Patent
Chen

(10) Patent No.: US 10,535,765 B2
(45) Date of Patent: Jan. 14, 2020

(54) POWER SEMICONDUCTOR DEVICE

(71) Applicant: UBIQ Semiconductor Corp., Hsinchu County (TW)

(72) Inventor: Chin-Fu Chen, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 16/118,449

(22) Filed: Aug. 31, 2018

(65) Prior Publication Data

US 2019/0326430 A1  Oct. 24, 2019

(30) Foreign Application Priority Data

Apr. 18, 2018 (TW) .............................. 107113161 A

(51) Int. Cl.
*H01L 29/78* (2006.01)
*H01L 29/417* (2006.01)
*H01L 29/10* (2006.01)

(52) U.S. Cl.
CPC ...... *H01L 29/7811* (2013.01); *H01L 29/1095* (2013.01); *H01L 29/41766* (2013.01); *H01L 29/7813* (2013.01)

(58) Field of Classification Search
CPC .................................................. H01L 29/7811
USPC ....................................................... 257/288
See application file for complete search history.

(56) References Cited

U.S. PATENT DOCUMENTS

| 8,067,800 | B2 | 11/2011 | Hsieh | |
| 8,138,033 | B2 | 3/2012 | Hossain et al. | |
| 9,620,585 | B1 * | 4/2017 | Loechelt | H01L 29/0634 |
| 2008/0035993 | A1 * | 2/2008 | Cao | H01L 29/407 |
| | | | | 257/333 |
| 2009/0090967 | A1 | 4/2009 | Chen et al. | |
| 2011/0233667 | A1 * | 9/2011 | Tai | H01L 29/407 |
| | | | | 257/334 |
| 2012/0091516 | A1 * | 4/2012 | Yang | H01L 29/0692 |
| | | | | 257/296 |
| 2014/0217495 | A1 * | 8/2014 | Wutte | H01L 29/407 |
| | | | | 257/328 |
| 2014/0264567 | A1 * | 9/2014 | Challa | H01L 29/7827 |
| | | | | 257/330 |
| 2015/0214300 | A1 * | 7/2015 | Barletta | H01L 29/7827 |
| | | | | 257/330 |
| 2016/0104766 | A1 | 4/2016 | Kelkar et al. | |
| 2017/0213906 | A1 * | 7/2017 | Li | H01L 29/7813 |

(Continued)

*Primary Examiner* — Jami Valentine Miller
(74) *Attorney, Agent, or Firm* — JCIPRNET

(57) ABSTRACT

A power semiconductor device including a substrate having an active region and a terminal region is provided. The terminal region surrounds the active region. A first epitaxial layer is disposed on the substrate in the active region and the terminal region. A second epitaxial layer is disposed on the first epitaxial layer. The second epitaxial layer includes a first termination trench, a second termination trench, and a third termination trench. The first termination trench is disposed in the terminal region and is adjacent to the active region. The second termination trench is disposed in the terminal region. The third termination trench is disposed in the terminal region. The second termination trench is located between the first termination trench and the third termination trench. The third termination trench has a third electrode electrically connected to a drain.

9 Claims, 3 Drawing Sheets

(56) References Cited

U.S. PATENT DOCUMENTS

2018/0337229 A1\* 11/2018 Tsai .................... H01L 29/0615
2018/0358431 A1\* 12/2018 Kagawa .............. H01L 29/1045

\* cited by examiner

POWER SEMICONDUCTOR DEVICE

CROSS-REFERENCE TO RELATED APPLICATION

This application claims the priority benefit of Taiwan application serial no. 107113161, filed on Apr. 18, 2018. The entirety of the above-mentioned patent application is hereby incorporated by reference herein and made a part of this specification.

BACKGROUND

Technical Field

The invention relates to a semiconductor device. More particularly, the invention relates to a power semiconductor device.

Description of Related Art

The power semiconductor device is a semiconductor device widely used in an analog circuit. Since the power semiconductor device has a very low conductance resistance and very fast switching speed, the power semiconductor device can be applied in a power switch circuit to make power management techniques more efficient.

With the advancement in technology, electronic devices are becoming compact. Since the size of electronic devices is getting smaller, maintaining a low conductance resistance and a high breakdown voltage for the power semiconductor device is also becoming difficult. Therefore, how to improve the conductance resistance and increase the breakdown voltage of the power semiconductor device under a certain device size is an important topic.

SUMMARY

The invention provides a power semiconductor device in which two epitaxial layers are disposed on a substrate and an outermost trench electrode in a terminal region is electrically connected to a drain, so as to improve electric field distortion at an edge of the trench electrode in the terminal region and to further increase a breakdown voltage of the power semiconductor device.

In an embodiment of the invention, a power semiconductor device includes a substrate having an active region and a terminal region. The terminal region surrounds the active region. A first epitaxial layer is disposed on the substrate in the active region and the terminal region. A second epitaxial layer is disposed on the first epitaxial layer. The second epitaxial layer includes a first termination trench, a second termination trench, and a third termination trench. The first termination trench is disposed in the terminal region and is adjacent to the active region. The second termination trench is disposed in the terminal region. The third termination trench is disposed in the terminal region. The second termination trench is located between the first termination trench and the third termination trench. The third termination trench has a third electrode electrically connected to a drain.

In an embodiment of the invention, the first termination trench has a first electrode being electrically connected to a source.

In an embodiment of the invention, the second termination trench has a second electrode being electrically connected to a source or electrically floating.

In an embodiment of the invention, a distance between the first termination trench and the second termination trench is greater than a distance between the second termination trench and the third termination trench.

In an embodiment of the invention, the power semiconductor device further includes a plurality of active trenches disposed in the second epitaxial layer in the active region, extending in a first direction, and alternately arranged along a second direction. The first direction is different from the second direction.

In an embodiment of the invention, the first termination trench and the active trenches are separated from each other.

In an embodiment of the invention, the first termination trench and the active trenches are connected to each other.

In an embodiment of the invention, a doping concentration of the second epitaxial layer is greater than a doping concentration of the first epitaxial layer.

In an embodiment of the invention, the first termination trench, the second termination trench, and the third termination trench are separated from each other.

In an embodiment of the invention, the first termination trench, the second termination trench, and the third termination trench further extend into the first epitaxial layer.

To sum up, the double epitaxial structure is used in the embodiments of the invention to reduce the conductance resistance of the power semiconductor device. In addition, the outermost trench electrode in the terminal region is electrically connected to the drain. In this way, the electric field distortion at the edge of the trench electrode in the terminal region is mitigated or even eliminated, and that the breakdown voltage of the power semiconductor device is further improved. Therefore, the power semiconductor device provided by the embodiments of the invention may deliver favorable device properties under a certain device size.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
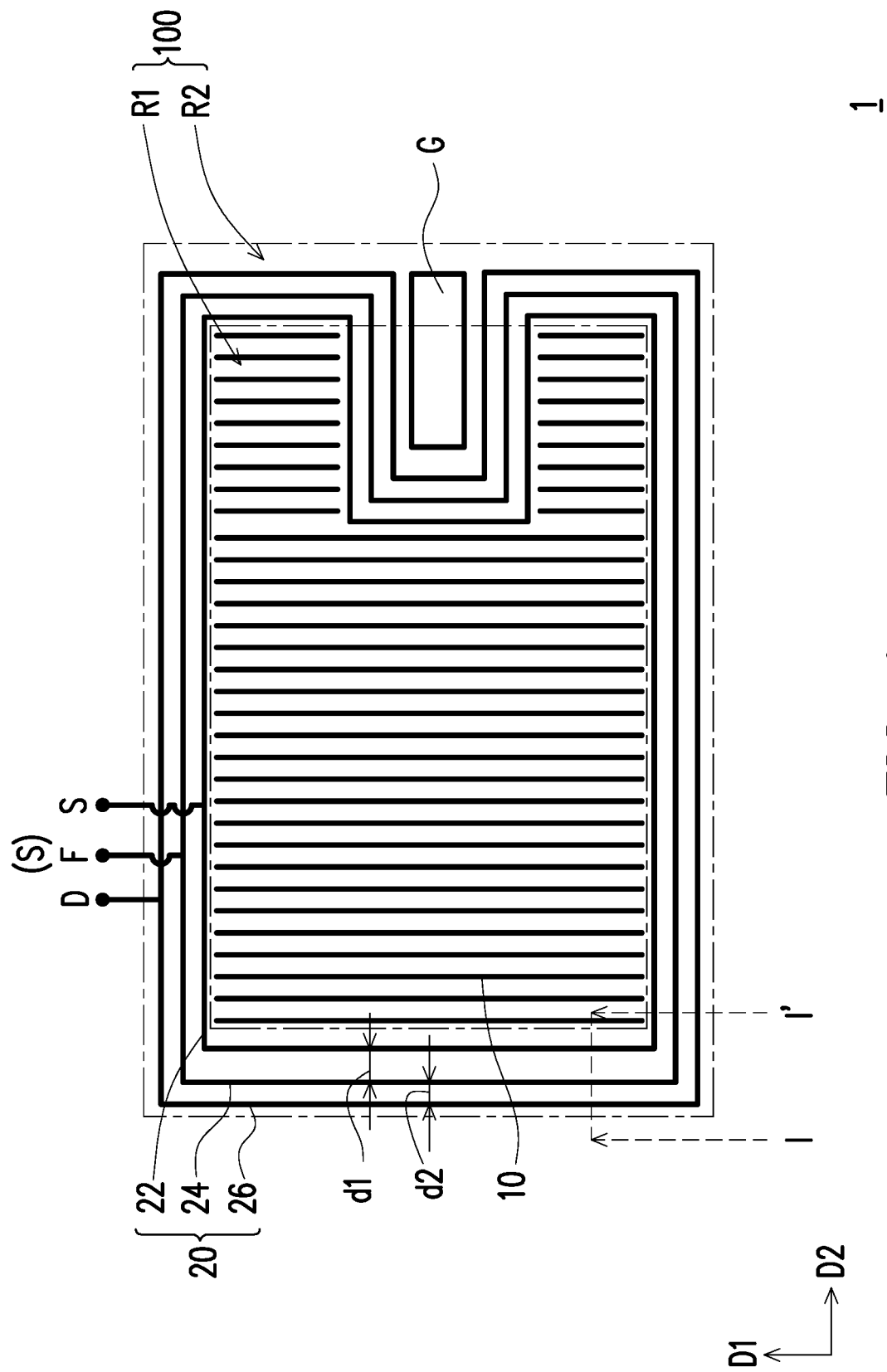
FIG. 1 is a schematic top view of a power semiconductor device according to a first embodiment of the invention.

The invention is more comprehensively described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Figure 2A:
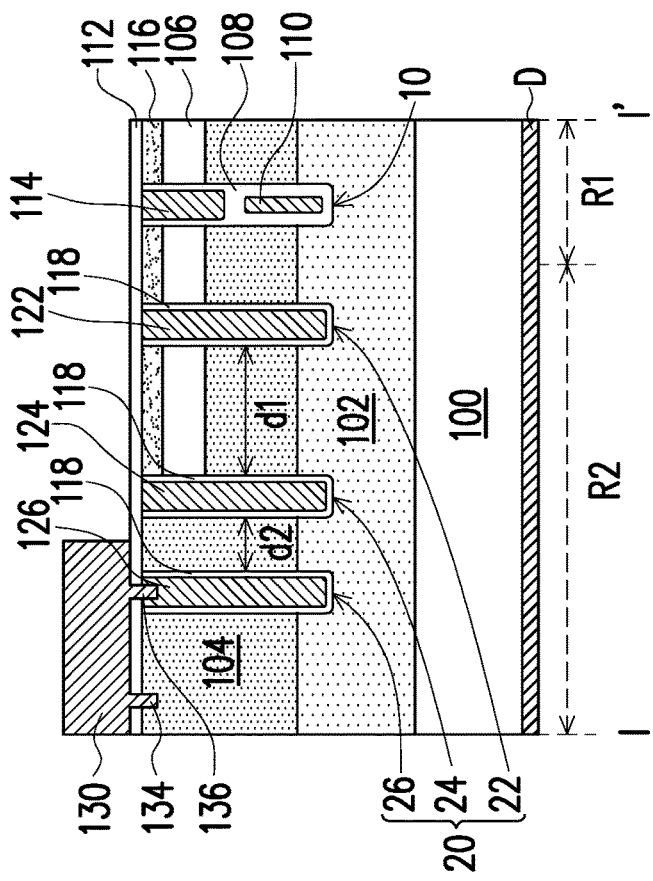
FIG. 2A is a schematic cross-sectional view taken along a line I-I' of FIG. 1.

FIG. 1 is a schematic top view of a power semiconductor device according to a first embodiment of the invention. FIG. 2A is a schematic cross-sectional view taken along a line I-I' of FIG. 1. In the following embodiments, the first conductivity type is N-type and the second conductivity type is P-type as an example. However, the invention is not limited thereto. Those having ordinary skill in the art should know that the first conductivity type can also be P-type and the second conductivity type can be N-type.

With reference to FIG. 1 and FIG. 2A, a power semiconductor device 1 provided by the first embodiment of the invention includes a substrate 100 having an active region R1 and a terminal region R2. The terminal region R2 surrounds the active region R1 to prevent voltage breakdown from occurring. The substrate 100 can be, for example, a semiconductor substrate or a semiconductor compound substrate. In this embodiment, the substrate 100 may be a semiconductor substrate having the first conductivity type, for example, a N-type heavily doped silicon substrate.

As shown in FIG. 2A, a first epitaxial layer 102 is disposed on the substrate 100 in the active region R1 and the terminal region R2. In an embodiment, the first epitaxial layer 102 is an epitaxial layer having the first conductivity type, for example, a N-type lightly doped epitaxial layer, and a forming method thereof includes performing a selective epitaxy growth (SEG) process. A second epitaxial 104 layer is disposed on the first epitaxial layer 102. That is, the first epitaxial layer 102 is disposed between the substrate 100 and the second epitaxial layer 104. In an embodiment, the second epitaxial layer 104 is an epitaxial layer having the first conductivity type, for example, a N-type lightly doped epitaxial layer, and a forming method thereof includes performing a selective epitaxy growth process. A doping concentration of the second epitaxial layer 104 is greater than a doping concentration of the first epitaxial layer 102, so as to form a double epitaxial structure. The double epitaxial structure is able to reduce conductance resistance of the power semiconductor device 1.

As shown in FIG. 1, the active region R1 has a plurality of active trenches 10. As shown in FIG. 2A, the active trench 10 is disposed in the second epitaxial layer 104 of the active region R1. The active trenches 10 extend along a first direction D1 and are arranged along a second direction D2. In an embodiment, the active trenches 10 are arranged in an equidistant manner and separated from each other. In an embodiment, at least one terminal face of each of the active trenches 10 is substantially aligned. As shown in FIG. 2A, each of the active trenches 10 has a conductive layer 110, an insulating layer 108, and a conductive layer 114 to form a trench gate structure. In an embodiment, the material of the conductive layer 110 and the conductive layer 114 includes doped polysilicon. The material of the insulating layer 108 includes silicon oxide.

In an embodiment, the conductive layer 110 can be used as a shield electrode, and the conductive layer 114 can be used as a gate and is electrically connected to a gate pad G, as shown in FIG. 1. The insulating layer 108 can be used as an inter-gate insulation layer between a gate (the conductive layer 114) and a shield gate (the conductive layer 110) to electrically insulate the conductor layer 110 and the conductive layer 114. Besides, a portion of the insulating layer 108 surrounding the conductive layer 110 electrically insulates the conductive layer 110 and the second epitaxial layer 104. Another portion of the insulating layer 108 surrounding the conductive layer 114 electrically insulates the conductive layer 114, a body layer 106, and a doped region 116.

Although the conductive layer 110 and the conductive layer 114 are illustrated to be separated from each other in FIG. 2A, but the invention is not limited thereto. In other embodiments, the conductive layer 110 and the conductive layer 114 may be connected to each other to form a single gate.

As shown in FIG. 1, the terminal region R2 has at least three termination trenches 20. The terminal region R2 has a first termination trench 22, a second termination trench 24, and a third termination trench 26. The first termination trench 22, the second termination trench 24, and the third termination trench 26 are separated from each other and are not connected. The first termination trench 22 is disposed in the second epitaxial layer 104 of the terminal region R2. The first termination trench 22 extends along the second direction D2 and surrounds the active trenches 10 in the active region R1 to form an enclosed annular trench. As shown in FIG. 1, the first termination trench 22 is adjacent to the active trenches 10 of the active region R1 and are separated from the active trenches 10 and are not connected. The first direction D1 is intersected with the second direction D2. In an embodiment, the first direction D1 is perpendicular to the second direction D2.

As shown in FIG. 2A, a first electrode 122 and an insulating layer 118 are included in the first termination trench 22 to form a terminal structure. The insulating layer 118 surrounds the first electrode 122 to electrically insulate the first electrode 122 and the second epitaxial layer 104. In an embodiment, the material of the first electrode 122 includes doped polysilicon. The material of the insulating layer 118 includes silicon oxide.

In addition, the second termination trench 24 is disposed in the terminal region R2 and surrounds the first termination trench 22 to form an enclosed annular trench. The third termination trench 26 is disposed in the terminal region R2 and surrounds the second termination trench 24 to form an enclosed annular trench. That is, as shown in FIG. 1, the second termination trench 24 is disposed between the first termination trench 22 and the third termination trench 26. In an embodiment, a distance d1 between the first termination trench 22 and the second termination trench 24 is greater than a distance d2 between the second termination trench 24 and the third termination trench 26 to ensure or increase the breakdown voltage. A ratio of the distance d1 to the distance d2 is designed according to actual device requirements and application conditions and is preferably between 2 and 50, but is not limited thereto.

As shown in FIG. 2A, a second electrode 124 and the insulating layer 118 are included in the second termination trench 24 to form a terminal structure. In an embodiment, the insulating layer 118 surrounds the second electrode 124 to electrically insulate the second electrode 124 and the second epitaxial layer 104. Similarly, a third electrode 126 and the insulating layer 118 are included in the third termination trench 26 to form a terminal structure. In an embodiment, the insulating layer 118 surrounds the third electrode 126 to electrically insulate the third electrode 126 and the second epitaxial layer 104. In an embodiment, the material of the second electrode 124 and the third electrode 126 includes doped polysilicon. The material of the insulating layer 118 includes silicon oxide.

As shown in FIG. 1 and FIG. 2A, the first electrode 122 is electrically connected to a source S, the second electrode 124 is electrically connected to the source S or is electrically floating F, and the third electrode 126 is electrically connected to a drain D. Since the third electrode 126 in the third termination trench 26 is electrically connected to the drain D to act as an isolation trench, a power line is limited to be located at an edge of the third electrode 126 in the third termination trench 26. Hence, electric field distortion at the edge of the third electrode 126 can be mitigated or even eliminated, and that the breakdown voltage of the power semiconductor device 1 is improved. In an embodiment, the difference between the doping concentrations of the first epitaxial layer 102 and the second epitaxial layer 104 lead to the electric field distortion. In this case, the outermost trench electrode is electrically connected to the drain in this embodiment, as such, the breakdown voltage of the power semiconductor device may be increased. Hence, the power semiconductor device of this embodiment can deliver favorable conductance resistance and breakdown voltage under a certain device size.

In this embodiment, the active trenches 10 can be used as cell trenches to house the trench gate structure, and the first termination trench 22, the second termination trench 24, and the third termination trench 26 can all be used to house the terminal structure. Although only 3 termination trenches 20 are illustrated in FIG. 1, but the invention is not limited thereto. In other embodiments, the power semiconductor device 1 can include a plurality of termination trenches to surround the active trenches 10. A number of the third termination trench 26 may be greater than 1 (i.e., 2, 3, 4, or greater) based on the difference between the doping concentrations of the first epitaxial layer 102 and the second epitaxial layer 104. Further, the third electrodes 126 in the third termination trenches 26 can all be electrically connected to the drain D.

As shown in FIG. 2A, the third electrode 126 in the third termination trench 26 can be electrically connected to the drain D through a plug 134, a plug 136, and a conductive layer 130. To be specific, the plug 134 extends from a bottom surface of the conductive layer 130 and penetrates a dielectric layer 112 for being in contact with the second epitaxial layer 104. The plug 136 extends from the bottom surface of the conductive layer 130 and penetrates the dielectric layer 112 for being in contact with the third electrode 126. Since the substrate 100, the first epitaxial layer 102, and the second epitaxial layer 104 have the same the conductivity type (e.g., the N-type), the third electrode 126 in the third termination trench 26 can be electrically connected to the drain D located at a bottom portion of the substrate 100 through the plug 136, the conductive layer 130, the plug 134, the second epitaxial layer 104, the first epitaxial layer 102, and the substrate 100. In other words, the third electrode 126 in the third termination trench 26 and the drain D have the same electrical potential. In an embodiment, the material of the plug 134, the plug 136, and the conductive layer 130 include a conductive material, and can be a metal, such as aluminum. The material of the dielectric layer 112 includes silicon oxide.

The power semiconductor device 1 of this embodiment further includes the body layer 106 and the doped region 116. The body layer 106 is disposed in the second epitaxial layer 104 between the active trenches 10, between the active trenches 10 and the first termination trench 22, and between the first termination trench 22 and the second termination trench 24. As shown in FIG. 2A, the body layer 106 surrounds the active trench 10 and the first termination trench 22. In an embodiment, the body layer 106 has the second conductivity type and is, for example, a P-type body layer. The doped region 116 is disposed in the body layer 106 and surrounds upper portions of the active trench 10 and the first termination trench 22. In an embodiment, the doped region 116 has the first conductivity type and is, for example, a N-type heavily doped region. In an embodiment, the doped region 116 can be used as the source. The first electrode 122 in the first termination trench 22 or the second electrode 124 in the second termination trench 24 can be electrically connected to the doped region 116 (i.e., the source) through different routing traces, which is not shown in FIG. 2A though. That is, the first electrode 122 or the second electrode 124 and the source may have the same electrical potential.

Figure 2B:
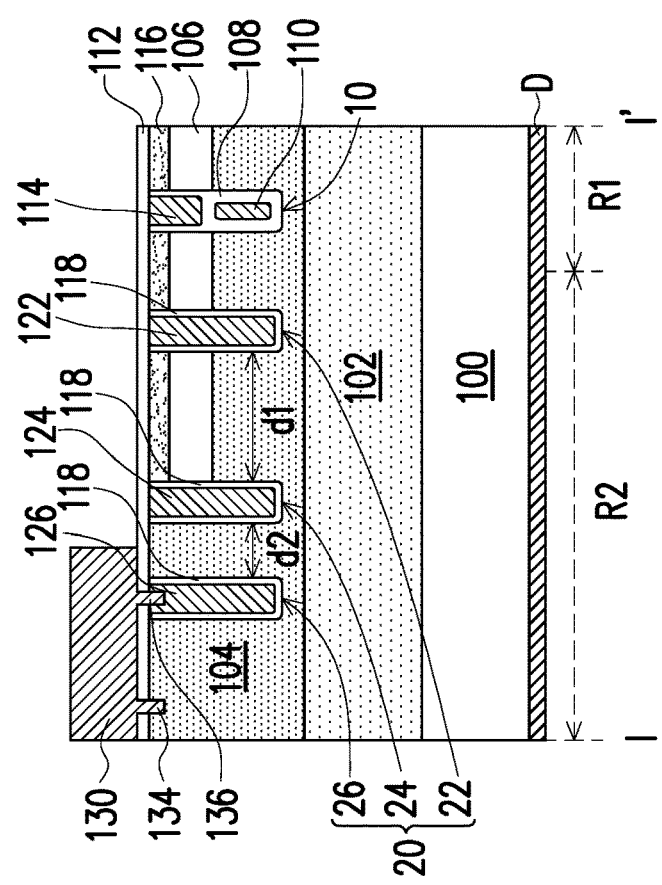
FIG. 2B is a schematic cross-sectional view taken along the line I-I' of FIG. 1.

FIG. 2B is a schematic cross-sectional view taken along the line I-I' of FIG. 1.

With reference to FIG. 2B and FIG. 2A, basically, a power semiconductor device 1b of FIG. 2B and a power semiconductor device 1a of FIG. 2A are similar. A difference between the two power semiconductor devices includes that the active trench 10, the first termination trench 22, the second termination trench 24, and the third termination trench 26 of the power semiconductor device 1b of FIG. 2B penetrate the second epitaxial layer 104 and extend into the first epitaxial layer 102. In other words, in the power semiconductor device 1b, a bottom surface of the active trench 10, a bottom surface of the first termination trench 22, a bottom surface of the second termination trench 24, and a bottom surface of the third termination trench 26 are below an interface between the first epitaxial layer 102 and the second epitaxial layer 104 as shown in FIG. 2B. In an embodiment, a bottom surface of the conductive layer 114 (e.g., the gate) in the active trench 10 can be below a bottom surface of the body layer 106 as shown in FIG. 2B, but the invention is not limited thereto. In other embodiments, the bottom surface of the conductive layer 114 in the active trench 10 can also be above the bottom surface of the body layer 106 according to design requirements as shown in FIG. 2A.

Figure 3:
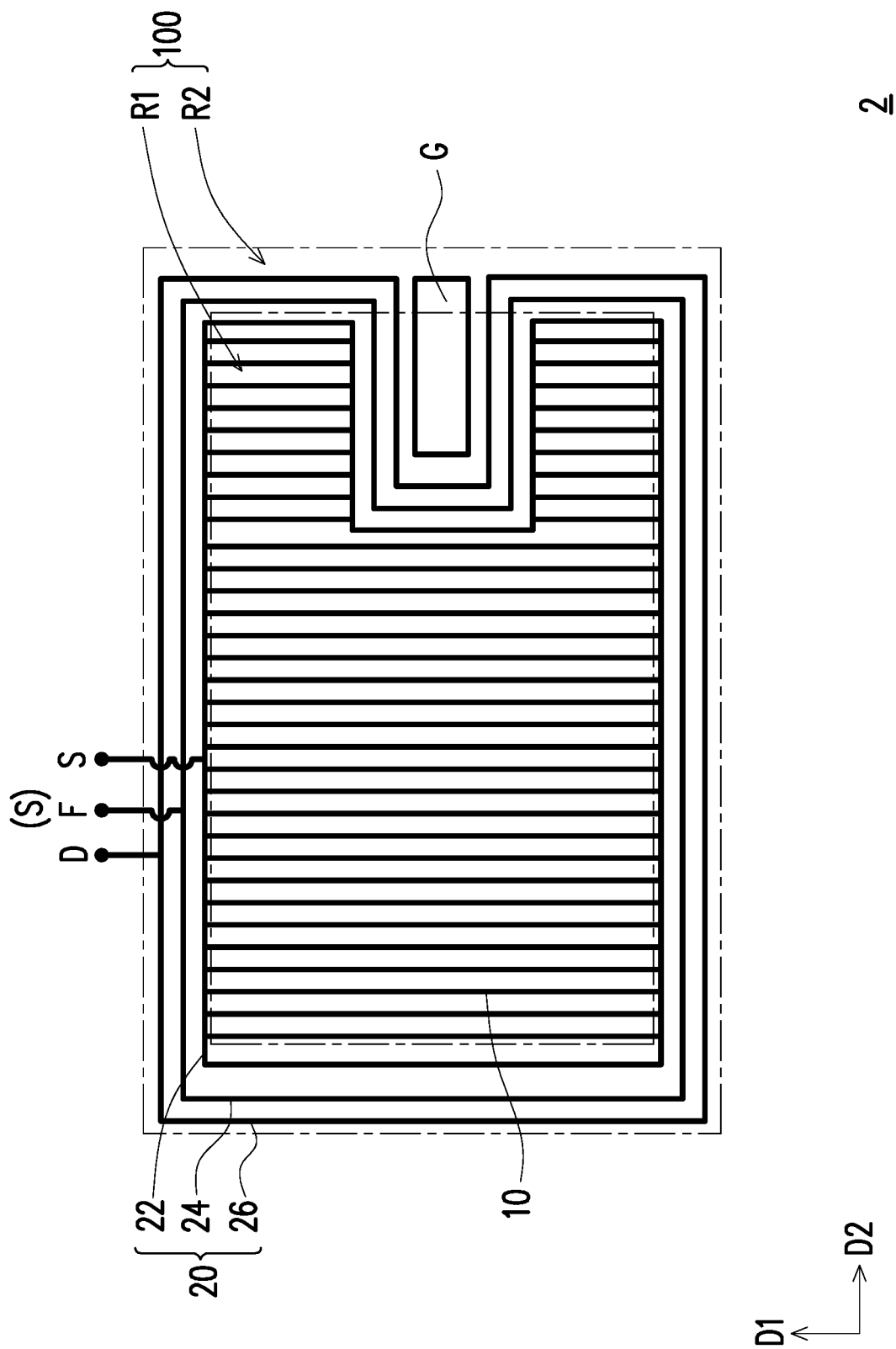
FIG. 3 is a schematic top view of a power semiconductor device according to a second embodiment of the invention.

FIG. 3 is a schematic top view of a power semiconductor device according to a second embodiment of the invention.

With reference to FIG. 3 and FIG. 1, basically, a power semiconductor device 2 of the second embodiment is similar to the power semiconductor device 1 of the first embodiment. A difference between the two power semiconductor devices includes that the first termination trench 22 and the active trenches 10 are connected to each other in the power semiconductor device 2 of the second embodiment. To be specific, the conductive layer 110 (e.g., the shield electrode) in the active trench 10 may be connected to the first electrode 122 in the first termination trench 22. In this way, when the first electrode 122 in the first termination trench 22 is electrically connected to the source, the first electrode 122, the conductive layer 110 (e.g., the shield electrode), and the source may have the same electrical potential.

In view of the foregoing, the double epitaxial structure is used in the embodiments of the invention to reduce the conductance resistance of the power semiconductor device. In addition, the outermost trench electrode in the terminal region is electrically connected to the drain in the embodiments of the invention. In this way, the electric field distortion at the edge of the trench electrode in the terminal region is mitigated or even eliminated, and that the breakdown voltage of the power semiconductor device is further improved. Therefore, the power semiconductor device provided by the embodiments of the invention may deliver favorable device properties under a certain device size.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power semiconductor device, comprising:
a substrate, having an active region and a terminal region, the terminal region surrounding the active region;
a first epitaxial layer, disposed on the substrate in the active region and the terminal region; and
a second epitaxial layer, disposed on the first epitaxial layer, wherein a doping concentration of the second epitaxial layer is greater than a doping concentration of the first epitaxial layer, wherein the second epitaxial layer comprises:
a first termination trench, disposed in the terminal region and adjacent to the active region;
a second termination trench, disposed in the terminal region; and
a third termination trench, disposed in the terminal region, wherein the second termination trench is located between the first termination trench and the third termination trench, and the third termination trench has a third electrode electrically connected to a drain.

2. The power semiconductor device as claimed in claim 1, wherein the first termination trench has a first electrode being electrically connected to a source.

3. The power semiconductor device as claimed in claim 1, wherein the second termination trench has a second electrode being electrically connected to a source or electrically floating.

4. The power semiconductor device as claimed in claim 1, wherein a distance between the first termination trench and the second termination trench is greater than a distance between the second termination trench and the third termination trench.

5. The power semiconductor device as claimed in claim 1, further comprising a plurality of active trenches, disposed in the second epitaxial layer in the active region, extending in a first direction, and alternately arranged along a second direction, wherein the first direction is different from the second direction.

6. The power semiconductor device as claimed in claim 5, wherein the first termination trench and the active trenches are separated from each other.

7. The power semiconductor device as claimed in claim 5, wherein the first termination trench and the active trenches are connected to each other.

8. The power semiconductor device as claimed in claim 1, wherein the first termination trench, the second termination trench, and the third termination trench are separated from each other.

9. The power semiconductor device as claimed in claim 1, wherein the first termination trench, the second termination trench, and the third termination trench further extend into the first epitaxial layer.

* * * * *